(12) United States Patent
Yonezawa et al.

(10) Patent No.: US 10,014,770 B1
(45) Date of Patent: Jul. 3, 2018

(54) POWER SUPPLY DEVICE, CONTROL CIRCUIT FOR POWER SUPPLY DEVICE, AND CONTROL METHOD FOR POWER SUPPLY DEVICE

(71) Applicant: FUJITSU LIMITED, Kawasaki-shi, Kanagawa (JP)

(72) Inventors: Yu Yonezawa, Sagamihara (JP); Yoshiyasu Nakashima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/796,907

(22) Filed: Oct. 30, 2017

(30) Foreign Application Priority Data

Dec. 8, 2016 (JP) .................................. 2016-238260

(51) Int. Cl.
*G05F 1/652* (2006.01)
*H02M 3/156* (2006.01)
*H02M 1/00* (2006.01)

(52) U.S. Cl.
CPC ............ *H02M 3/156* (2013.01); *H02M 1/00* (2013.01); *H02M 2001/0009* (2013.01)

(58) Field of Classification Search
CPC .. H02M 3/1584; H02M 3/285; H02M 3/1588; H02M 2001/0009; Y02B 70/1466
USPC ....... 322/222, 223, 225, 265, 271, 273, 282, 322/285, 290; 363/51, 56.01, 65
See application file for complete search history.

(56) References Cited

U.S. PATENT DOCUMENTS

| 6,414,469 | B1 * | 7/2002 | Zhou | G05F 1/62 323/272 |
| 8,188,721 | B2 * | 5/2012 | Isham | H02M 3/156 323/282 |
| 8,207,711 | B2 * | 6/2012 | Crawford | H05B 33/0815 315/291 |
| 8,710,810 | B1 * | 4/2014 | McJimsey | H02M 3/1584 323/272 |

(Continued)

FOREIGN PATENT DOCUMENTS

| JP | 2004-282842 | 10/2004 |
| JP | 2012-161146 | 8/2012 |

OTHER PUBLICATIONS

Hassan Pooya Forghani-Zadeh et al., "Current-Sensing Techniques for DC-DC Converters", The 2002 45th Midwest Symposium on Circuits and Systems, MWSCAS-2002, IEEE, pp. II-577-580, 2002 (4 pages).

(Continued)

*Primary Examiner* — Rajnikant Patel
(74) *Attorney, Agent, or Firm* — Fujitsu Patent Center

(57) ABSTRACT

A power supply device coupled to a load includes a first switch that switches a current input from an input terminal, a second switch that switches between a ground potential and an output of the first switch, an inductor that establishes a connection between an output terminal and the output of the first switch, a current sensing circuit that senses a peak current value serving as a peak value of a current flowing through the inductor, and a control circuit that controls a first control terminal of the first switch and a second control terminal of the second switch and that calculates a value of an output current flowing through the load, based on an output value of a temporal coefficient circuit coupled to one of a first control signal.

6 Claims, 15 Drawing Sheets

(56) References Cited

U.S. PATENT DOCUMENTS 9,763,289 B2 * 9/2017 Herfurth ............ H05B 33/0803
2012/0194157 A1 8/2012 Kawashima

OTHER PUBLICATIONS

Raghavan Sampath, "Digital Peak Current Mode Control of Buck Converter Using MC56F8257 DSC", Freescale Semiconductor Application note, Document No. AN4716, Rev.1, pp. 1-22, May 2013 (22 pages).

* cited by examiner

US 10,014,770 B1

POWER SUPPLY DEVICE, CONTROL CIRCUIT FOR POWER SUPPLY DEVICE, AND CONTROL METHOD FOR POWER SUPPLY DEVICE

CROSS-REFERENCE TO RELATED APPLICATION

This application is based upon and claims the benefit of priority of the prior Japanese Patent Application No. 2016-238260, filed on Dec. 8, 2016, the entire contents of which are incorporated herein by reference.

FIELD

The embodiments discussed herein are related to a power supply device, a control circuit for the power supply device, and a control method for the power supply device.

BACKGROUND

In the past, by using a control circuit such as a microcontroller, a switching power supply circuit has been digitally controlled. There is an advantage that, by digitally controlling, it is possible to precisely control a timing of switching of a switching element and it is possible to implement various functions with software.

In addition, a multi-phase converter in which power supply circuits are connected in parallel is proposed. By deviating phases of switching between the power supply circuits, it becomes possible for the multi-phase converter to reduce a ripple current and to achieve enlargement of a current and a high efficiency. In the multi-phase converter, in many cases a digital control method is used in order to perform precise timing control.

In a power supply device utilizing the digital control method, a control circuit obtains, based on calculation, a value of an output current flowing through a load and uses the value of an output current for controlling an output voltage value and for avoiding an overcurrent. The output current value may be calculated by using a peak current value of an inductance element connected between an output terminal of a power supply circuit and a switching element.

However, calculation for calculating the output current value by using the peak current value is complex, and there is a problem that a load on the control circuit is increased.

The followings are reference documents.
[Document 1] Japanese Laid-open Patent Publication No. 2012-161146,
[Document 2] Japanese Laid-open Patent Publication No. 2004-282842,
[Document 3] Hassan Pooya Forghani-zadeh, "Current-Sensing Techniques for DC-DC Converters", The 2002 45th Midwest Symposium on Circuits and Systems, 2002, MWSCAS-2002, and
[Document 4] Raghavan Sampath, "Digital Peak Current Mode Control of Buck Converter Using MC56F8257 DSC", Freescale Semiconductor Application Note, Document Number: AN4716, Rev.1, 05/2013.

SUMMARY

According to an aspect of the invention, a power supply device coupled to a load includes a first switch that switches a current input from an input terminal, a second switch that switches between a ground potential and an output of the first switch, an inductor that establishes a connection between an output terminal and the output of the first switch, a current sensing circuit that senses a peak current value serving as a peak value of a current flowing through the inductor, and a control circuit that controls a first control terminal of the first switch and a second control terminal of the second switch and that calculates a value of an output current flowing through the load, based on an output value of a temporal coefficient circuit coupled to one of a first control signal for controlling the first control terminal and a second control signal for controlling the second control terminal and on the peak current value sensed by the current sensing circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments for implementing the present technology will be described with reference to drawings.

First Embodiment

Figure 1:
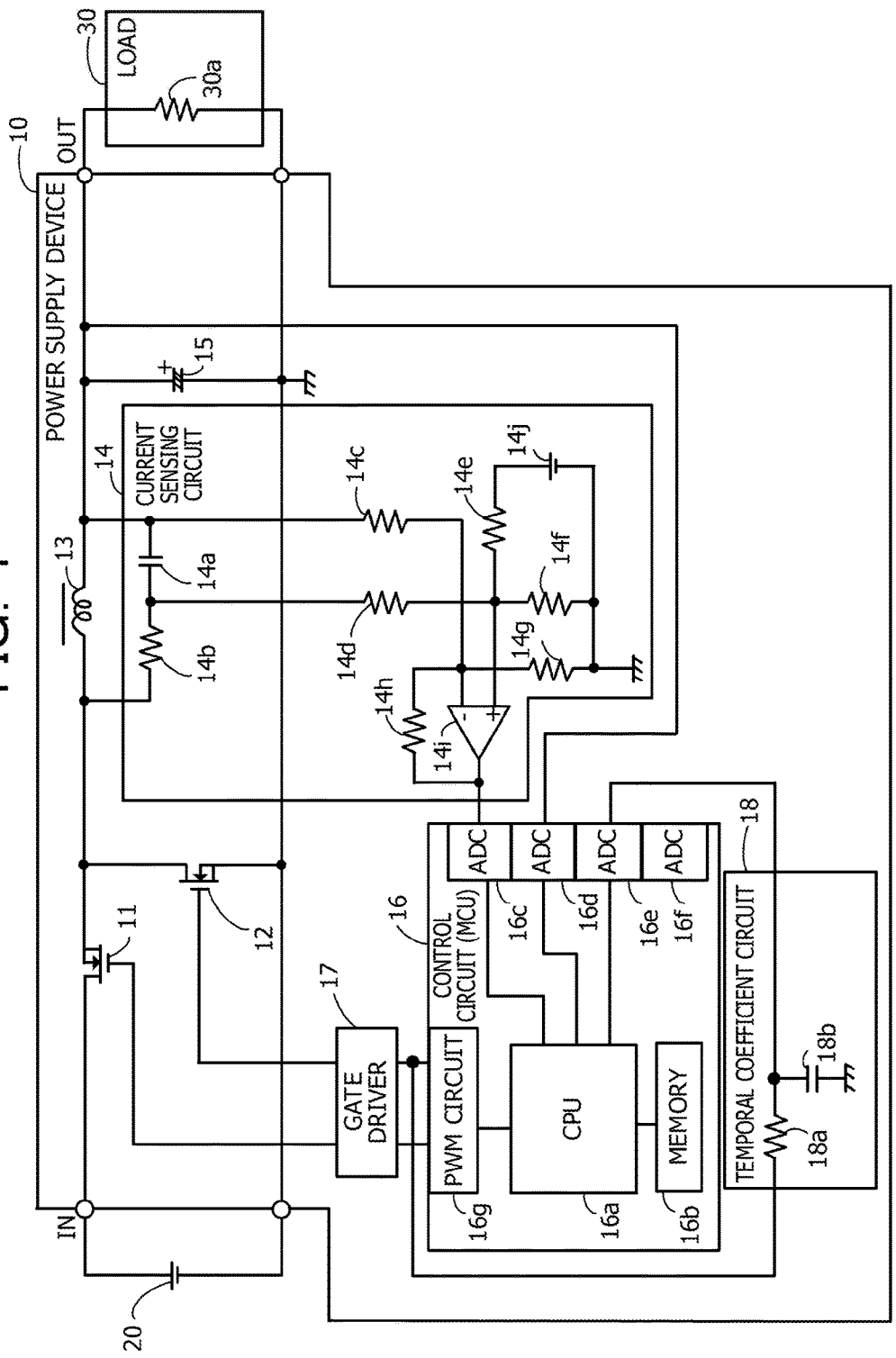
FIG. 1 is a diagram illustrating an example of a power supply device of a first embodiment.

FIG. 1 is a diagram illustrating an example of a power supply device of a first embodiment.

A power supply device 10 converts a magnitude of an input voltage supplied by a power supply 20, thereby supplying the input voltage to a load 30 including a load resistance 30*a*.

The power supply device 10 includes switching elements 11 and 12, an inductance element 13, a current sensing circuit 14, a capacitance element 15, a control circuit 16, a gate driver 17, and a temporal coefficient circuit 18.

The switching element 11 switches a current input from an input terminal IN of the power supply device 10. The switching element 12 switches between a ground potential and an output of the switching element 11. Each of the switching elements 11 and 12 is an n-channel type metal oxide semiconductor field effect transistor (MOSFET) or the like, for example.

The switching elements 11 and 12 each include two terminals and a control terminal. In a case where each of the switching elements 11 and 12 is the n-channel type MOSFET, the two terminals are drain and source terminals, and the control terminal is a gate terminal.

One of the two terminals of the switching element 11 is connected to the input terminal IN, and the other terminal is connected to one of the two terminals of the switching element 12 and one of two terminals of the inductance element 13. The other terminal of the switching element 12 is grounded. Note that the ground potential does not have to be 0 V and may slightly fluctuate. The control terminals of the respective switching elements 11 and 12 are connected to the gate driver 17. Note that the switching element 12 is controlled so as to be put into an off-state in a case where the switching element 11 is put into an on-state and that the switching element 12 is controlled so as to be put into an on-state in a case where the switching element 11 is put into an off-state.

The inductance element 13 establishes a connection between an output terminal OUT of the power supply device and the output of the switching element 11. In other words, one of the two ends of the end inductance element 13 is connected to the other terminal (an output terminal) of the switching element 11, and the other end of the inductance element 13 is connected to the output terminal OUT.

The current sensing circuit 14 senses a peak current value serving as a peak value of a current flowing through the inductance element 13.

The current sensing circuit 14 includes a capacitance element 14*a*, resistance elements 14*b*, 14*c*, 14*d*, 14*e*, 14*f*, 14*g*, and 14*h*, an amplifier 14*i*, and a bias supply 14*j*. The capacitance element 14*a* and the resistance element 14*b* are connected in series, and a series circuit based on the capacitance element 14*a* and the resistance element 14*b* is connected in parallel to the inductance element 13. One of two ends of the resistance element 14*c* is connected to the output terminal OUT, and the other end of the resistance element 14*c* is connected to an inverting input terminal of the amplifier 14*i*. One of two ends of the resistance element 14*d* is connected between the capacitance element 14*a* and the resistance element 14*b*, and the other end of the resistance element 14*d* is connected to a non-inverting input terminal of the amplifier 14*i*. One of two ends of the resistance element 14*e* is connected to the bias supply 14*j*, and the other end of the resistance element 14*e* is connected to the non-inverting input terminal of the amplifier 14*i*. One of two ends of the resistance element 14*f* is connected to the non-inverting input terminal of the amplifier 14*i*, and the other end of the resistance element 14*f* is grounded. One of two ends of the resistance element 14*g* is connected to the inverting input terminal of the amplifier 14*i*, and the other end of the resistance element 14*g* is grounded. One of two ends of the resistance element 14*h* is connected to an output terminal of the amplifier 14*i*, and the other end of the resistance element 14*h* is connected to the inverting input terminal of the amplifier 14*i*. The above-mentioned connections cause the amplifier 14*i* to function as a differential amplifier. The bias supply 14*j* generates a bias voltage to be supplied to the amplifier 14*i*.

The capacitance element 15 holds an output voltage to be supplied to the load 30. One of two ends of the capacitance element 15 is connected to the output terminal OUT, and the other end of the capacitance element 15 is grounded.

The control circuit 16 controls the control terminals of the respective switching elements 11 and 12. In addition, based on an output value of the temporal coefficient circuit 18 connected to a control signal for controlling the control terminal of the switching element 12 and the peak current value sensed by the current sensing circuit 14, the control circuit 16 calculates a value of an output current flowing through the load 30.

The control circuit 16 includes a central processing unit (CPU) 16*a*, a memory 16*b*, analog to digital converters (ADCs) 16*c*, 16*d*, 16*e*, and 16*f*, and a pulse width modulation (PWM) circuit 16*g*. The control circuit 16 is a micro control unit (MCU), for example.

The CPU 16*a* executes a program stored in the memory 16*b*, thereby calculating the value of the output current flowing through the load 30, by using the output value of the temporal coefficient circuit 18, the peak current value, and an output voltage value. In addition, the CPU 16*a* determines a duty ratio of a switching pulse so that the output voltage value becomes a target value, and the CPU 16*a* transmits the duty ratio to the PWM circuit 16*g*. In addition, the CPU 16*a* determines whether or not the output current value is an overcurrent, and in a case of the overcurrent, the CPU 16*a* transmits a stop signal to the PWM circuit 16*g*.

Figure 2:
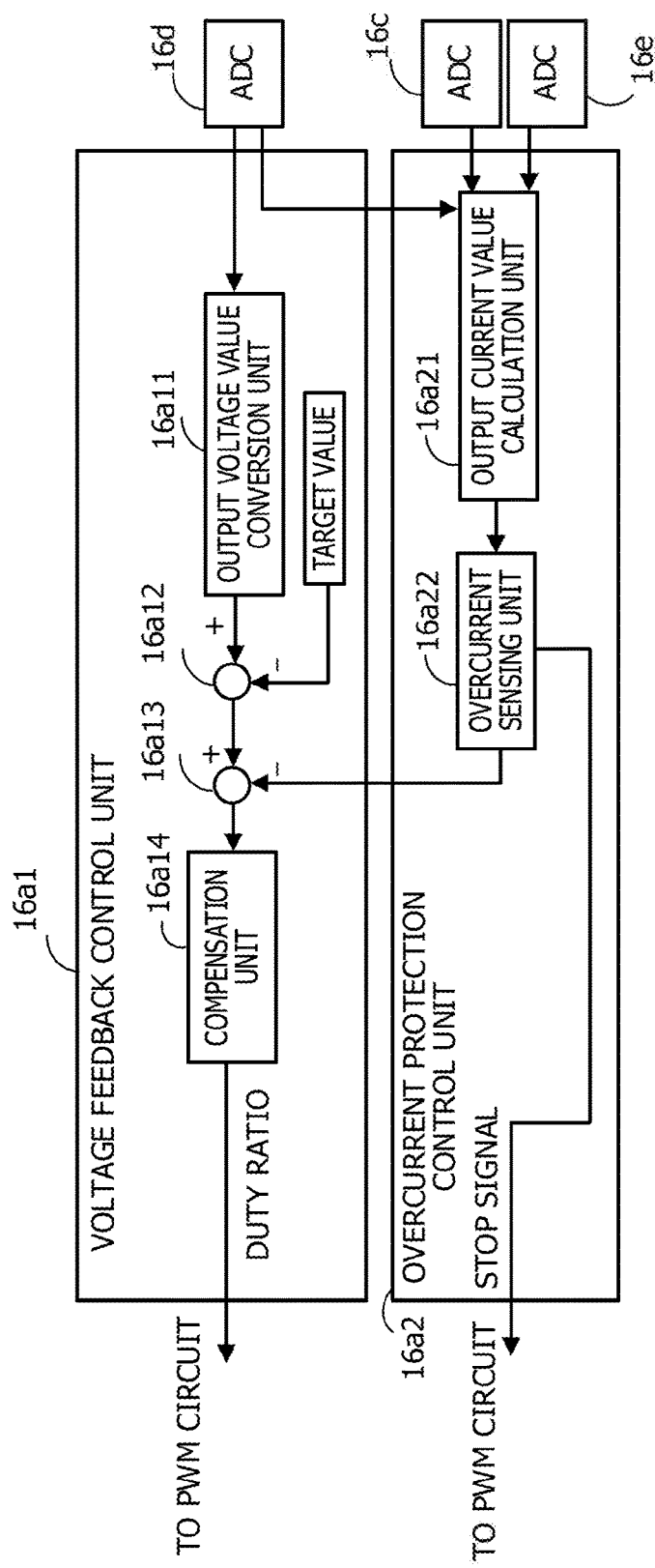
FIG. 2 is a functional block diagram illustrating examples of functions of a CPU.

FIG. 2 is a functional block diagram illustrating examples of functions of a CPU.

The CPU 16*a* performs functions of a voltage feedback control unit 16*a*1 and an overcurrent protection control unit 16*a*2.

Based on a difference between the output voltage value of the power supply device 10 and the target value and an output value of the overcurrent protection control unit 16*a*2, the voltage feedback control unit 16*a*1 determines and outputs the duty ratio of the switching pulse.

The voltage feedback control unit 16*a*1 includes an output voltage value conversion unit 16*a*11, subtraction units 16*a*12 and 16*a*13, and a compensation unit 16*a*14. The output voltage value conversion unit 16*a*11 receives an AD conversion result of the output voltage value of the power supply device 10, output by the ADC 16*d*, and converts the AD conversion result to an output voltage value handled by the CPU 16*a* for calculation. The subtraction unit 16*a*12 outputs the difference between the output voltage value and the target value. The subtraction unit 16*a*13 outputs a value obtained by subtracting an output value (a control value to be described later) of the overcurrent protection control unit 16*a*2 from the difference between the output voltage value and the target value. Based on an output value of the subtraction unit 16*a*13, the compensation unit 16*a*14 determines and outputs the duty ratio.

Based on the peak current value of a current that flows through the inductance element 13 and that is sensed by the current sensing circuit 14, the overcurrent protection control unit 16*a*2 calculates the output current value of the power supply device 10 and determines whether or not that output current value is an overcurrent. In addition, in a case where the output current value is an overcurrent, the overcurrent protection control unit 16a2 outputs a control value for stopping the PWM circuit 16g or reducing a magnitude of the output voltage value.

The overcurrent protection control unit 16a2 includes an output current value calculation unit 16a21 and an overcurrent sensing unit 16a22. Based on an AD conversion result of the above-mentioned peak current value, output by the ADC 16c, the AD conversion result of the output voltage value, output by the ADC 16d, and an AD conversion result of the output value of the temporal coefficient circuit 18, output by the ADC 16e, the output current value calculation unit 16a21 calculates the output current value. The overcurrent sensing unit 16a22 determines whether or not the output current value is an overcurrent. In addition, in a case where the output current value is an overcurrent, the overcurrent sensing unit 16a22 outputs the control value for stopping the PWM circuit 16g or reducing the magnitude of the output voltage value.

A description will be returned to the explanation of FIG. 1.

The memory 16b stores therein a program to be executed by the CPU 16a and various kinds of data.

The ADCs 16c to 16f each convert, into a digital signal, one of input signals of the control circuit 16, thereby supplying the digital signal to the CPU 16a. In the example of FIG. 1, the ADC 16c AD-converts and outputs the peak current value that is sensed by the current sensing circuit 14 and that serves as an analog value. In addition, the ADC 16d AD-converts and outputs the output voltage value serving as an analog value. In addition, the ADC 16e AD-converts and outputs the output value of the temporal coefficient circuit 18, which serves as an analog value. Note that the ADC 16f may be omitted.

The PWM circuit 16g is an example of a gate control circuit and outputs control signals (gate control signals) that are used for the respective switching elements 11 and 12 and that are used for causing the switching elements 11 and 12 to execute switching operations based on respective duty ratios supplied by the CPU 16a.

Based on individual control signals output by the control circuit 16, the gate driver 17 outputs control voltages (gate voltages of n-channel type MOSFETs, for example) to be supplied to the control terminals of the respective switching elements 11 and 12.

The temporal coefficient circuit 18 functions as an integration circuit (or a low pass filter) and outputs an output value obtained by performing filtering on the control signal for controlling the switching element 12. The temporal coefficient circuit 18 includes a resistance element 18a, one of two ends of which receives the above-mentioned control signal, and a capacitance element 18b, one of two ends of which is connected to the other end of the resistance element 18a. The other end of the resistance element 18a is further connected to the ADC 16e in the control circuit 16, and the other end of the capacitance element 18b is grounded.

By the way, based on, for example, the following Expression (1), the output current value calculation unit 16a21 in FIG. 2 calculates an output current value Iout.

$$Iout = Ipeak - (1 - Vo/E) \cdot k \cdot Vo \quad (1)$$

In Expression (1), "Ipeak" is the peak current value serving as a peak value of a current flowing through the inductance element 13. "Vo" is the output voltage value, and "E" is an input voltage value. In addition, $k = (1/2) \cdot (1/L) \cdot (1/fsw)$ is satisfied, "L" is an inductance value of the inductance element 13, and "fsw" is a switching frequency. Note that "k" is preliminarily stored in the memory 16b, for example.

Expression (1) includes two multiplication operations, one division operation, and two subtraction operations.

In the power supply device 10 of the present embodiment, (1−Vo/E) included in Expression (1) is generated by the temporal coefficient circuit 18.

Hereinafter, a reason why (1−Vo/E) is obtained by the temporal coefficient circuit 18 will be described.

Figure 3:
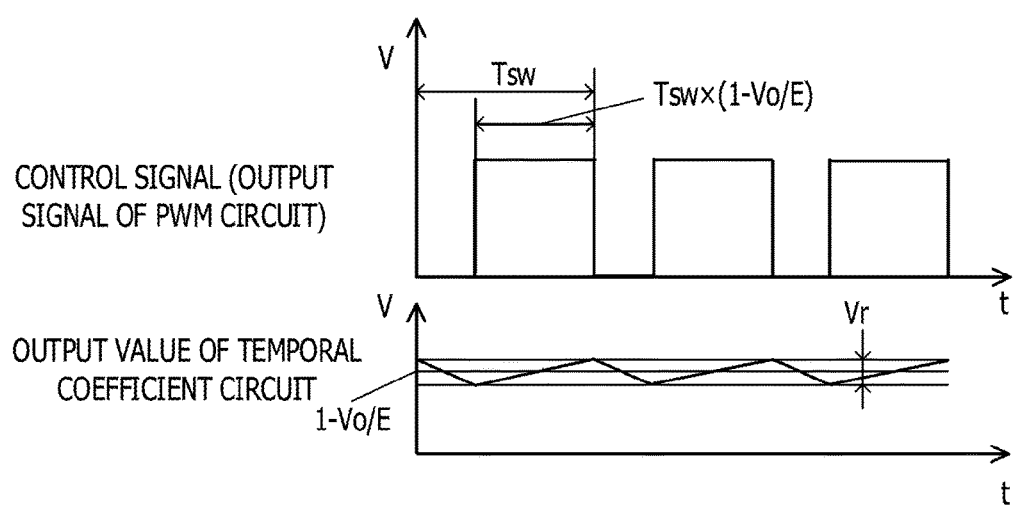
FIG. 3 is a diagram illustrating examples of a control signal output by a PWM circuit and an output value of a temporal coefficient circuit.

FIG. 3 is a diagram illustrating examples of a control signal output by a PWM circuit and an output value of a temporal coefficient circuit. Vertical axes each indicate a voltage V, and horizontal axes each indicate a time t.

FIG. 3 illustrates an example of the control signal that is used for the switching element 12 and that is output by the PWM circuit 16g, and an example of the output value of the temporal coefficient circuit 18. In FIG. 3, "Tsw" is a switching period. In addition, "Vr" is a ripple voltage of the output value of the temporal coefficient circuit 18.

In what follows, it is assumed that the switching element 12 is put into an on-state in a case where the control signal is at a high (H) level (1 V, for example) and that the switching element 12 is put into an off-state in a case where the control signal is at a low (L) level (0 V, for example).

In the step-down type power supply device 10, a switching pulse width Ton1 of the switching element 12 (a time period during which the switching element 12 is put into an on-state) is expressed by the following Expression (2).

$$Ton1 = (1 - D) \cdot Tsw \quad (2)$$

In Expression (2), "D" is a duty ratio of a switching pulse. Since Vo=D×E is satisfied, D=Vo/E is satisfied. Accordingly, Expression (2) is expressed as Expression (3).

$$Ton1 = (1 - Vo/E) \cdot Tsw \quad (3)$$

In a case where a control signal having such a switching pulse width Ton1 as illustrated in Expression (3) is input to the temporal coefficient circuit 18, a value close to a direct-current component of the control signal (an average value of the control signal) is obtained by a function of the low pass filter. The average value of the control signal is a value obtained by dividing, by the switching period Tsw, an integrated value of the control signal in a time period of the switching pulse width Ton1 In a case where it is assumed that an amplitude of the control signal is 1 V, the integrated value is equal to "Ton1" in Expression (3), and therefore, "Ton1" is divided by the switching period Tsw, thereby obtaining the average value of "1−Vo/E".

In other words, as the output value of the temporal coefficient circuit 18, a value close to "1−Vo/E" is obtained.

In the example of FIG. 3, the ripple voltage Vr is generated in the output value of the temporal coefficient circuit 18. A fluctuation in the calculated output current value increases with an increase in the ripple voltage Vr. Therefore, it is desirable to keep a fluctuation in the output current value from exceeding a resolution capability of current sensing in the control circuit 16. Therefore, it is preferable that the ripple voltage Vr satisfies the following Expression (4).

$$Vr < (Ireso/Imax) \cdot Vfs \quad (4)$$

In Expression (4), "Ireso" indicates a minimum resolution capability of a current value recognizable to the control circuit 16. "Imax" indicates a maximum value of a current value recognizable to the control circuit 16. "Ireso" and "Imax" are determined in accordance with a specification of the power supply device 10.

In a case where the power supply device 10 has a specification for keeping an overcurrent within a range exceeding a rated current by, for example, 0.1 A, "Ireso" is set to a value (0.01 A or the like, for example) lower than 0.1 A. Note that this value is equivalent to a value indicated by a least significant bit (LSB) of data normally determined at a time of performing AD conversion in the control circuit 16.

In addition, in a case where the power supply device 10 has a specification in which a current having a value of 100 A at a maximum flows, "Imax" is set to a value (120 A or the like, for example) higher than 100 A while leaving a margin, for example. Note that this value is equivalent to a value indicated by a most significant bit (MSB) of data normally determined at a time of performing the AD conversion in the control circuit 16.

In addition, "Vfs" in Expression (4) is a full scale of a detected voltage.

An attenuation G by which the temporal coefficient circuit 18 attenuates the ripple voltage Vr so that the ripple voltage Vr satisfies Expression (4) is expressed as Expression (5).

$$G = 20 \log_{10}((Ireso/Imax) \cdot Vfs) \text{ [dB]} \quad (5)$$

A cutoff frequency fc for realizing this attenuation G is expressed as Expression (6).

$$fc = fsw/(G/10^{-20}) \text{ [Hz]} \quad (6)$$

In accordance with this Expression (6), a resistance value of the resistance element 18a of the temporal coefficient circuit 18 and a capacitance value of the capacitance element 18b thereof are determined.

It is assumed that "Ireso"=1 A, "Imax"=100 A, "Vfs"=1 V, and "fsw"=200 kHz are satisfied, for example. In this case, $G = 20 \log_{10}(1/100 \cdot 1) = -40$ [dB] is satisfied based on Expression (5), and $fc = 200 \times 10^3/(-40/10^{-20}) = 2000$ [Hz] is satisfied based on Expression (6). In a case where it is assumed that a capacitance value Cf of the capacitance element 18b is, for example, 3300 pF, a resistance value Rf of the resistance element 18a is expressed as the following Expression (7).

$$Rf = 1/(2\pi \cdot fc \cdot Cf) = 1/(27 \times 2000 \times 3300 \times 10^{-12}) = 24114 [\Omega] \quad (7)$$

Therefore, the resistance element 18a having the resistance value Rf of about 24 kΩ only has to be used.

In a case where it is assumed that (1−Vo/E) serving as such an output value of the temporal coefficient circuit 18 as described above is a1, Expression (1) is expressed as Expression (8).

$$Iout = Ipeak - \alpha 1 \cdot k \cdot Vo \quad (8)$$

Note that, in a case where an amplitude A of the control signal output by the PWM circuit 16g is not 1 V, a value obtained by multiplying (1−Vo/E) by the amplitude A is output by the temporal coefficient circuit 18. Therefore, $\alpha 1 = A \cdot (1 - Vo/E)$ is satisfied.

Hereinafter, an operation of the power supply device 10 of the first embodiment will be described.

Figure 4:
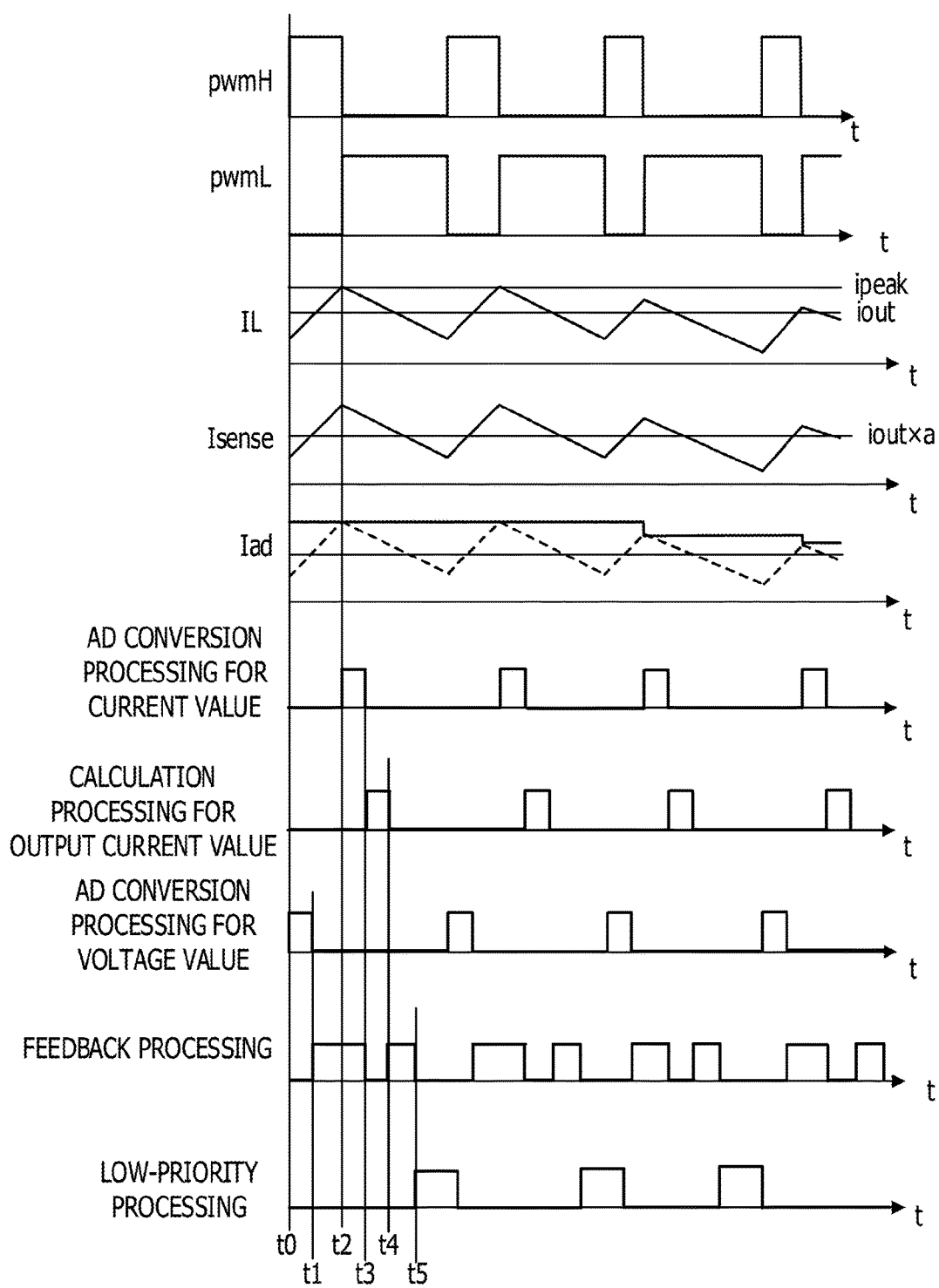
FIG. 4 is a timing chart illustrating an example of an operation of the power supply device of the first embodiment.

FIG. 4 is a timing chart illustrating an example of an operation of the power supply device of the first embodiment.

FIG. 4 illustrates examples of temporal changes in a control signal pwmH that is used for the switching element 11 and that is output by the PWM circuit 16g, a control signal pwmL that is used for the switching element 12 and that is output by the PWM circuit 16g, and a current value IL flowing through the inductance element 13. In addition, examples of temporal changes in an output value Isense of the current sensing circuit 14 and an AD conversion result Iad, based on the ADC 16c, of the output value Isense are illustrated. Furthermore, examples of operation timings of AD conversion processing for the output value Isense (a current value), calculation processing for the output current value, AD conversion processing for a voltage value, feedback processing, and low-priority processing are illustrated.

The control signal pwmH and the control signal pwmL differ in phase by 180 degrees. The current value IL starts increasing in a case where the control signal pwmH rises to an H level (1 V, for example), and the current value IL starts decreasing in a case where the control signal pwmH falls to an L level (0 V, for example). In a case where it is assumed that a value of the current value IL at a timing is "iout", the output value Isense of the current sensing circuit 14 at that timing is "iout×a" under the assumption that an amplification factor is "a".

In a case where the control signal pwmH rises to the H level (at a timing t0), the AD conversion processing for the voltage value (the output voltage value of the power supply device 10), based on the ADC 16d, is started. In a case where that AD conversion processing finishes (at a timing t1), the feedback processing (adjustment processing for a duty ratio) based on the voltage feedback control unit 16a1 illustrated in FIG. 2 is performed.

In a case where the control signal pwmH falls to the L level (at a timing t2), the AD conversion processing for a current value (the peak current value ipeak), based on the ADC 16c, is started. In addition, in a case where that AD conversion processing finishes (at a timing t3), the calculation processing for the output current value, based on the output current value calculation unit 16a21, is started. During the calculation processing for the output current value, the feedback processing is interrupted. In other words, the calculation of the output current value is performed in priority to the feedback processing.

In a case where the calculation processing for the output current value finishes (at a timing t4), the feedback processing is resumed. In a case where the feedback processing finishes (at a timing t5), the control circuit 16 performs the low-priority processing (communication processing utilizing, for example, a communication interface not illustrated, or the like). After that, the same processing operations are performed.

Figure 5:
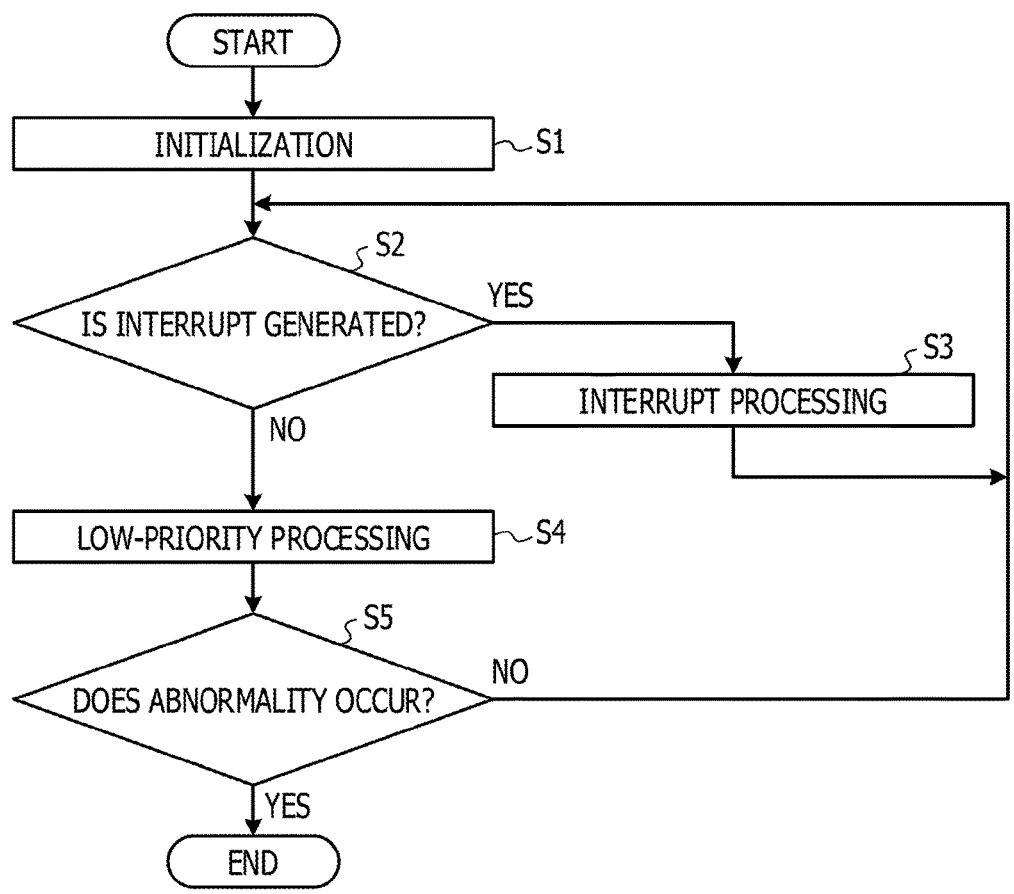
FIG. 5 is a flowchart (part one) illustrating a flow of an example of an operation of the power supply device of the first embodiment.
Figure 6:
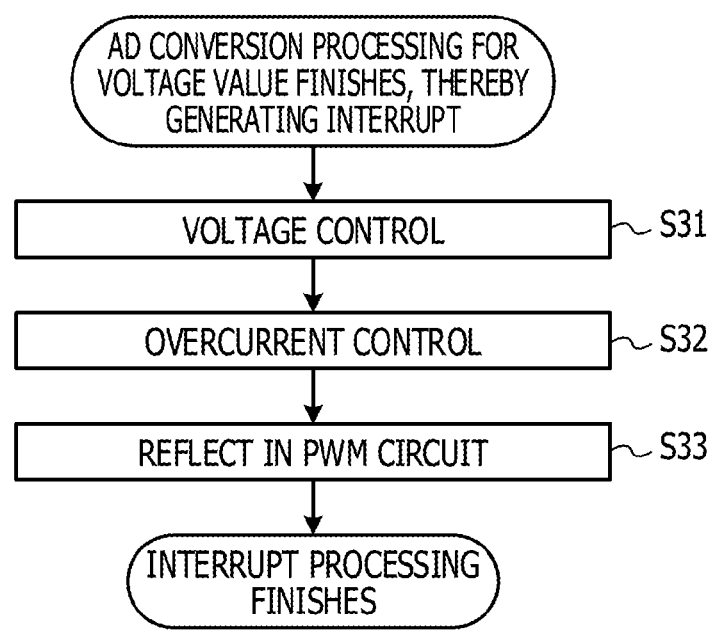
FIG. 6 is a flowchart (part two) illustrating a flow of an example of an operation of the power supply device of the first embodiment.
Figure 7:
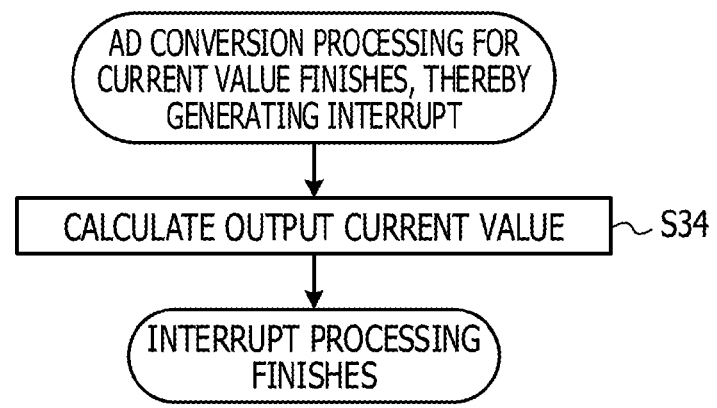
FIG. 7 is a flowchart (part three) illustrating a flow of an example of an operation of the power supply device of the first embodiment.

Each of FIG. 5, FIG. 6, and FIG. 7 is a flowchart illustrating a flow of an example of an operation of the power supply device of the first embodiment.

As illustrated in FIG. 5, first the CPU 16a performs initialization of a duty ratio and so forth (step S1), and after that, the CPU 16a determines whether or not an interrupt is generated (step S2). The interrupt is generated by termination of the AD conversion processing for the current value or the voltage value, illustrated in FIG. 4.

In a case where the interrupt is generated, the CPU 16a performs interrupt processing (step S3), and after that, the CPU 16a repeats the processing operations in and after step S2. In a case where no interrupt is generated, the CPU 16a performs the low-priority processing (step S4). After that, the CPU 16a determines whether or not an abnormality occurs (step S5), and the CPU 16a terminates the processing in a case where an abnormality occurs, and the CPU 16a repeats the processing operations in and after step S2 in a case where no abnormality occurs.

As illustrated in FIG. 6, in a case where the AD conversion processing for the voltage value finishes, thereby generating an interrupt, the CPU 16a performs voltage control (adjustment processing for a duty ratio) and overcurrent control (outputting of the stop signal, based on a previous calculation result of the output current value, or the like) (steps S31 and S32). After that, the CPU 16a reflects, in the PWM circuit 16g, results of the voltage control and the overcurrent control (step S33) and terminates the interrupt processing.

As illustrated in FIG. 7, in a case where the AD conversion processing for the current value finishes, thereby generating an interrupt, the CPU 16a calculates, based on Expression (8), the output current value (step S34) and terminates the interrupt processing.

As described above, in the power supply device 10 of the first embodiment, by using α1 serving as the output value of the temporal coefficient circuit 18, the control circuit 16 only has to calculate Expression (8) in place of Expression (1). Expression (8) includes two multiplication operations and one subtraction operation, and it is possible to reduce a calculation amount in the control circuit 16, compared with Expression (1). Therefore, according to the power supply device 10 of the first embodiment, it is possible to effectively calculate the output current value.

Second Embodiment

Figure 8:
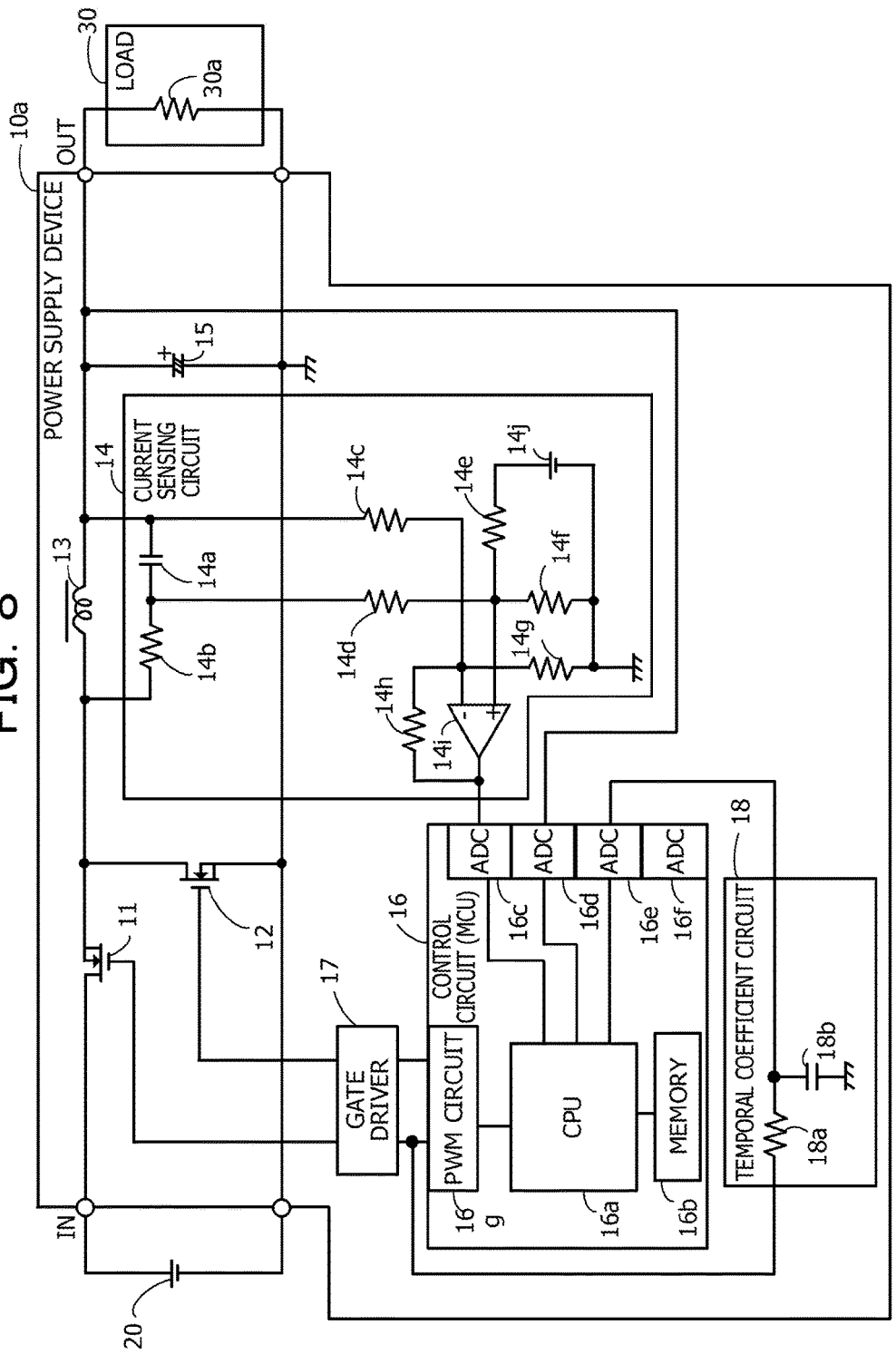
FIG. 8 is a diagram illustrating an example of a power supply device of a second embodiment.

FIG. 8 is a diagram illustrating an example of a power supply device of a second embodiment. In FIG. 8, the same symbol is assigned to the same element as that in the power supply device 10 illustrated in FIG. 1.

In a power supply device 10a of the second embodiment, the temporal coefficient circuit 18 outputs an output value obtained by performing filtering on a control signal for controlling the switching element 11. The above-mentioned control signal is supplied to one of the two ends of the resistance element 18a of the temporal coefficient circuit 18.

For this reason, in the power supply device 10a of the second embodiment, in a case where the amplitude A of the above-mentioned control signal is 1 V, the output value of the temporal coefficient circuit 18 becomes Vo/E. Hereinafter, a reason why Vo/E is obtained by the temporal coefficient circuit 18 will be described.

Figure 9:
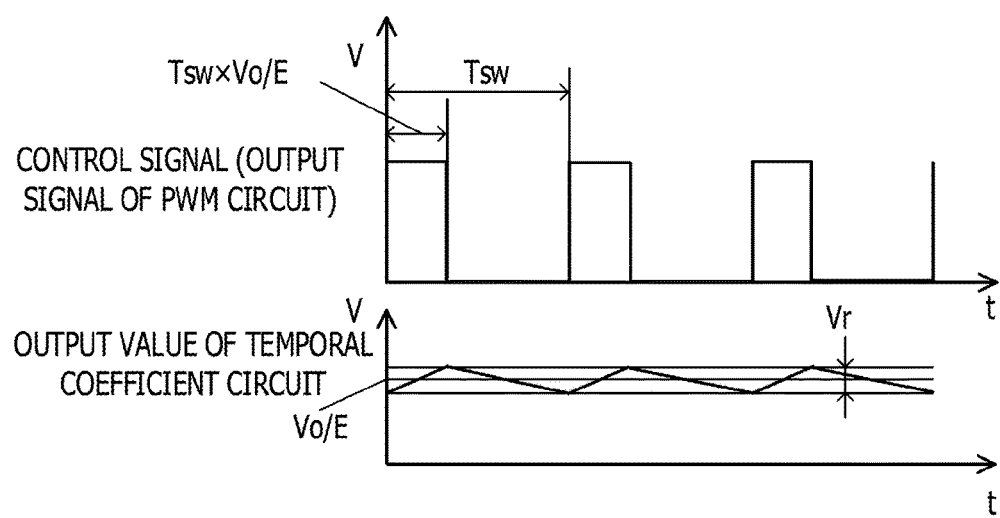
FIG. 9 is a diagram illustrating examples of a control signal output by a PWM circuit and an output value of a temporal coefficient circuit.

FIG. 9 is a diagram illustrating examples of a control signal output by a PWM circuit and an output value of a temporal coefficient circuit. Vertical axes each indicate a voltage V, and horizontal axes each indicate a time t.

FIG. 9 illustrates an example of the control signal that is used for the switching element 11 and that is output by the PWM circuit 16g, and an example of the output value of the temporal coefficient circuit 18. In FIG. 9, "Tsw" is a switching period. In addition, "Vr" is a ripple voltage of the output value of the temporal coefficient circuit 18.

In what follows, it is assumed that the switching element 11 is put into an on-state in a case where the control signal is at an H level (1 V, for example) and that the switching element 11 is put into an off-state in a case where the control signal is at an L level (0 V, for example).

In the step-down type power supply device 10a, a switching pulse width Ton2 of the switching element 11 (a time period during which the switching element 11 is put into an on-state) is expressed by the following Expression (9).

$$Ton2 = D \cdot Tsw \quad (9)$$

In Expression (9), "D" is a duty ratio. Since Vo=D×E is satisfied, D=Vo/E is satisfied. Accordingly, Expression (9) is expressed as Expression (10).

$$Ton2 = (Vo/E) \cdot Tsw \quad (10)$$

In a case where a control signal having such a switching pulse width Ton2 as illustrated in Expression (10) is input to the temporal coefficient circuit 18, a value close to a direct-current component of the control signal (an average value of the control signal) is obtained by the function of the low pass filter. The average value of the control signal is a value obtained by dividing, by the switching period Tsw, an integrated value of the control signal in a time period of the switching pulse width Tong. In a case where it is assumed that an amplitude of the control signal is 1 V, the integrated value is equal to "Tong" in Expression (10), and therefore, "Tong" is divided by the switching period Tsw, thereby obtaining the average value of "Vo/E". In other words, as the output value of the temporal coefficient circuit 18, a value close to "Vo/E" is obtained.

Note that a design method for the resistance value of the resistance element 18a and the capacitance value of the capacitance element 18b in the temporal coefficient circuit 18 used for suppressing the ripple voltage Vr is the same as the design method described for the power supply device 10 of the first embodiment.

In a case where it is assumed that (Vo/E) serving as such an output value of the temporal coefficient circuit 18 as described above is α2, Expression (1) is expressed as Expression (11).

$$Iout = Ipeak - (1-\alpha2) \cdot k \cdot Vo \quad (11)$$

Note that, in a case where the amplitude A of the control signal output by the PWM circuit 16g is not 1 V, a value obtained by multiplying (Vo/E) by the amplitude A is output by the temporal coefficient circuit 18. Therefore, α2=A·(Vo/E) is satisfied.

Regarding the power supply device 10a of the second embodiment, the same operation as the operation of the power supply device 10 of the first embodiment illustrated in FIG. 4 to FIG. 7 is performed.

In the power supply device 10a of the second embodiment, by using α2 serving as the output value of the temporal coefficient circuit 18, the control circuit 16 only has to calculate Expression (11) in place of Expression (1). Expression (11) includes two multiplication operations and two subtraction operations, and it is possible to reduce a calculation amount in the control circuit 16, compared with Expression (1). Therefore, according to the power supply device 10a of the second embodiment, it is possible to effectively calculate the output current value.

Third Embodiment

Figure 10:
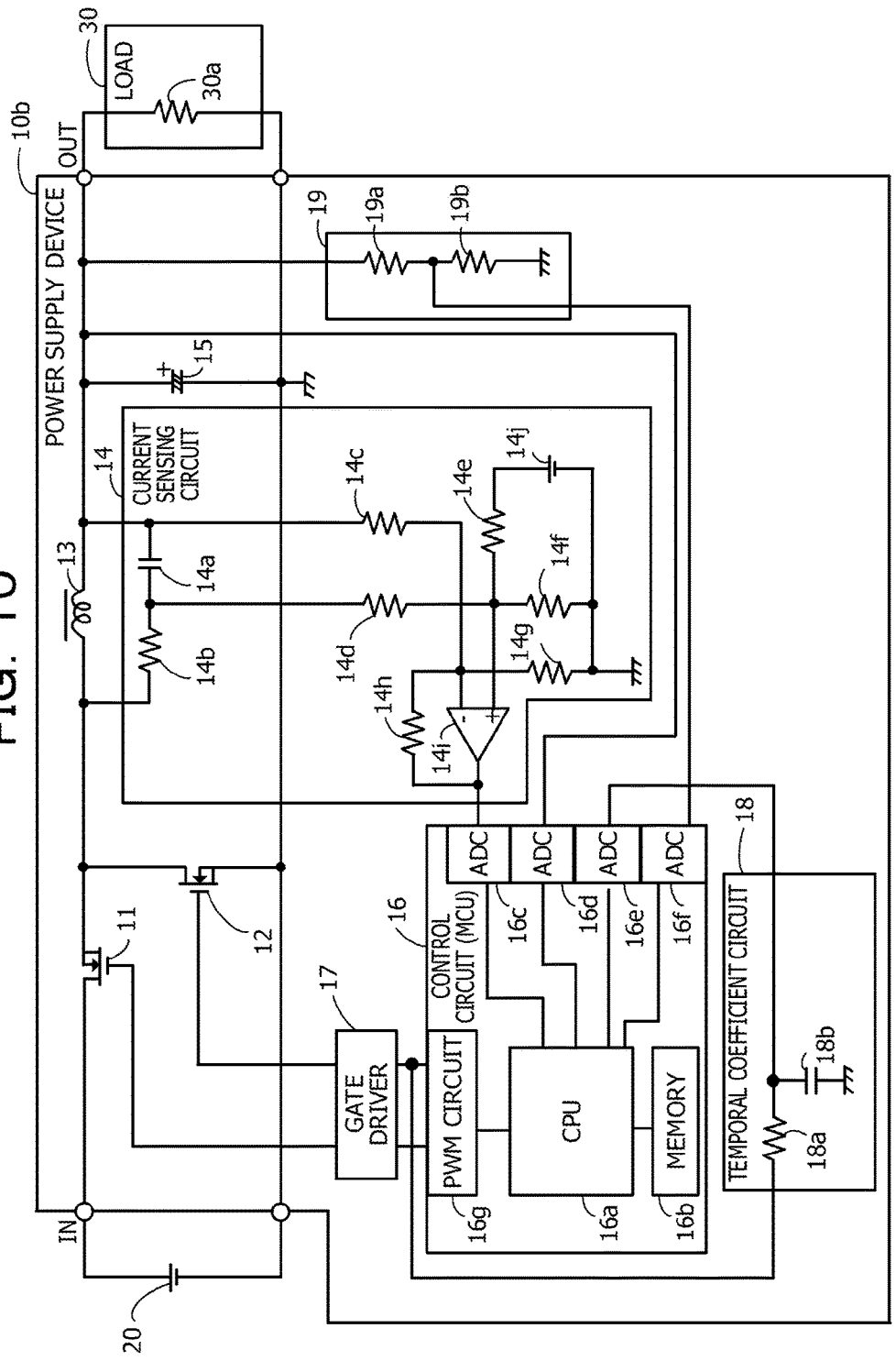
FIG. 10 is a diagram illustrating an example of a power supply device of a third embodiment.

FIG. 10 is a diagram illustrating an example of a power supply device of a third embodiment. In FIG. 10, the same symbol is assigned to the same element as that in the power supply device 10 illustrated in FIG. 1.

A power supply device 10b of the third embodiment includes a voltage-dividing circuit 19 connected to the load 30. The voltage-dividing circuit 19 includes resistance elements 19a and 19b connected in series. One of two ends of the resistance element 19a is connected to the load 30 via the output terminal OUT. The other end of the resistance element 19a is connected to one of two ends of the resistance element 19b and the ADC 16 of the control circuit 16. The other end of the resistance element 19b is grounded.

Such a voltage-dividing circuit 19 supplies, to the ADC 16f, an output value obtained by resistively voltage-dividing the output voltage value Vo. Resistance values of the respective resistance elements 19a and 19b are adjusted so that the voltage-dividing circuit 19 outputs "k·Vo" of Expression (8). In a case where the resistance value of the resistance element 19a is "Ra" and the resistance value of the resistance element 19b is "Rb", the resistance values Ra and Rb are determined so as to satisfy relationships of Expression (12) and Expression (13).

$$K=Ra/(Ra+Rb) \qquad (12)$$

$$Rb=Ra \cdot ((1/k)-1) \qquad (13)$$

As described above, k=(1/2)·(1/L)·(1/fsw) is satisfied. In a case of, for example, L=10 μH and fsw=200 kHz, k=(1/2)·(1/(10×10$^{-6}$))·(1/(200×10$^3$))=0.25 is satisfied. In a case of Ra=10 kΩ in Expression (13), Rb=10×10$^3$×((1/0.25)−1)=30 [kΩ] is satisfied.

In a case where it is assumed that "k·Vo" serving as such an output value of the voltage-dividing circuit 19 as described above is β, Expression (8) is expressed as Expression (14).

$$Iout=Ipeak-\alpha 1 \cdot \beta \qquad (14)$$

In the power supply device 10b of the third embodiment, the same operation as the operation of the power supply device 10 of the first embodiment illustrated in FIG. 4 to FIG. 7 is performed.

In the power supply device 10b of the third embodiment, by using the output value β of the voltage-dividing circuit 19 in addition to α1 serving as the above-mentioned output value of the temporal coefficient circuit 18, the control circuit 16 only has to calculate Expression (14) in place of Expression (1). Expression (14) includes one multiplication operation and one subtraction operation, and it is possible to further reduce a calculation amount in the control circuit 16. Therefore, according to the power supply device 10b of the third embodiment, it is possible to more effectively calculate the output current value.

Note that such a voltage-dividing circuit 19 as described above may be placed in the power supply device 10a of the second embodiment.

Fourth Embodiment

Figure 11:
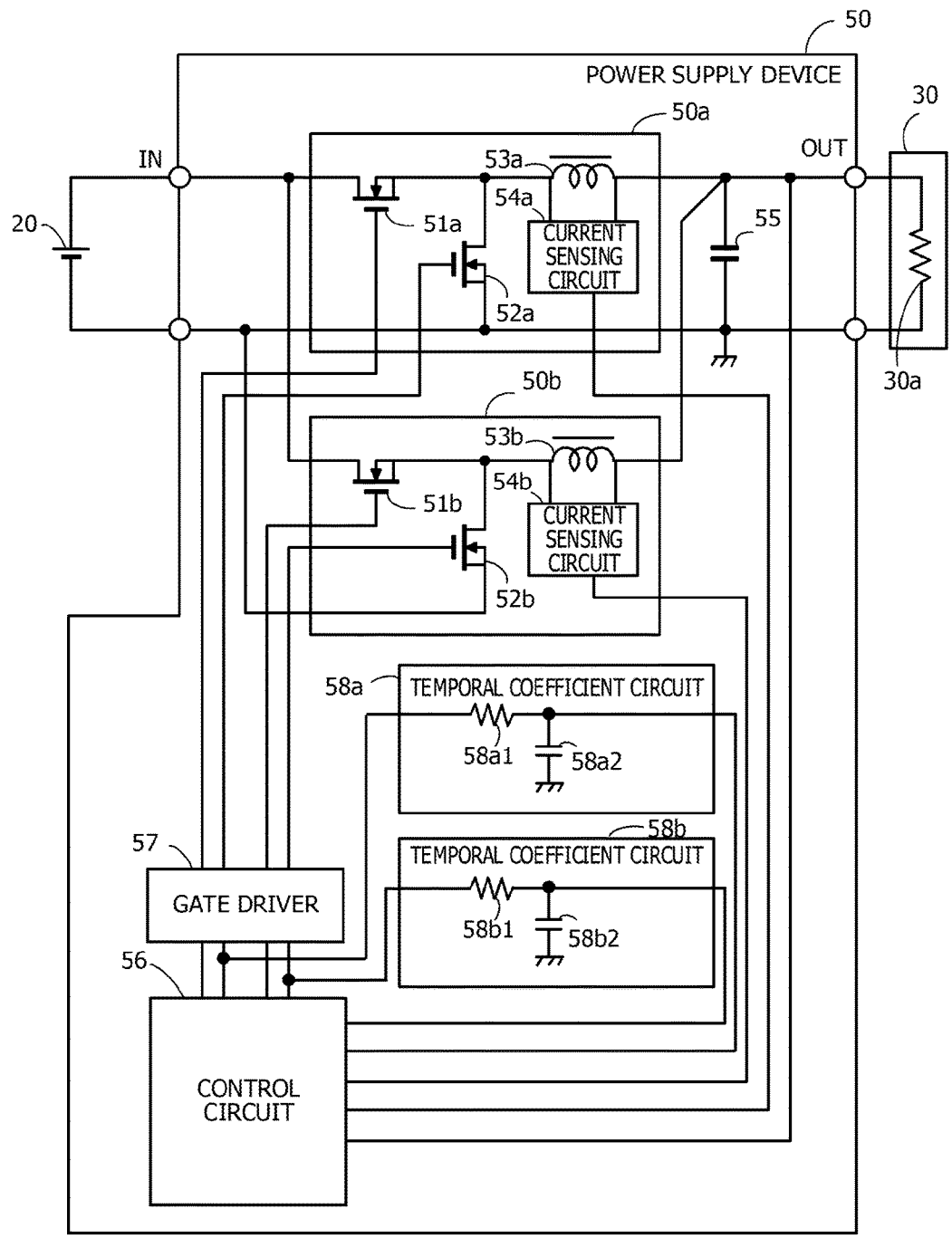
FIG. 11 is a diagram illustrating an example of a power supply device of a fourth embodiment.

FIG. 11 is a diagram illustrating an example of a power supply device of a fourth embodiment.

A power supply device 50 of the fourth embodiment is a multi-phase type power supply device the number of phases of which is two.

The power supply device 50 includes two combinations each including elements individually corresponding to the switching elements 11 and 12, the inductance element 13, and the current sensing circuit 14 in the power supply device 10 of the first embodiment illustrated in FIG. 1. In other words, the power supply device 50 includes switching elements 51a and 52a, an inductance element 53a, a current sensing circuit 54a, switching elements 51b and 52b, an inductance element 53b, and a current sensing circuit 54b. Hereinafter, a portion including the switching elements 51a and 52a, the inductance element 53a, and the current sensing circuit 54a is called a power supply circuit 50a, and a portion including the switching elements 51b and 52b, the inductance element 53b, and the current sensing circuit 54b is called a power supply circuit 50b.

The power supply circuits 50a and 50b are connected in parallel between the input terminal IN and the output terminal OUT. A circuit configuration of each of the power supply circuits 50a and 50b is the same as the circuit configuration of the switching elements 11 and 12, the inductance element 13, and the current sensing circuit 14 in the power supply device 10 of the first embodiment.

The power supply device 50 further includes a capacitance element 55, a control circuit 56, a gate driver 57, and temporal coefficient circuits 58a and 58b.

The capacitance element 55 holds an output voltage to be supplied to the load 30. One of two ends of the capacitance element 55 is connected to the output terminal OUT, and the other end of the capacitance element 55 is grounded.

The control circuit 56 controls control terminals of the respective switching elements 51a, 52a, 51b, and 52b. The control circuit 56 includes the same elements as those in the control circuit 16 illustrated in FIG. 1 while illustrations thereof are omitted. While the number of inputs is increased compared with the control circuit 16 in FIG. 1, the control circuit 56 includes ADCs that each perform AD conversion on one of the inputs. In addition, by using output values of the respective temporal coefficient circuits 58a and 58b, peak current values sensed by the respective current sensing circuits 54a and 54b, and the output voltage value, the control circuit 56 calculates output current values of the respective power supply circuits 50a and 50b. In addition, the control circuit 56 determines duty ratios of switching pulses so that the output voltage value becomes a target value. The control circuit 56 outputs control signals used for causing the switching elements 51a, 52a, 51b, and 52b to perform switching operations based on the duty ratios. In addition, the control circuit 56 determines whether or not the output current value of one of the power supply circuits 50a and 50b is an overcurrent, and in a case of an overcurrent, the control circuit 56 stops corresponding switching operations of the switching elements 51a, 52a, 51b, and 52b, for example.

Based on the individual control signals output by the control circuit 56, the gate driver 57 outputs control voltages (gate voltages of n-channel type MOSFETs, for example) to be supplied to the control terminals of the respective switching elements 51a, 52a, 51b, and 52b.

The temporal coefficient circuits 58a and 58b function as integration circuits (or low pass filters) and output output values obtained by performing filtering on the control signals for controlling the respective switching elements 52a and 52b.

The temporal coefficient circuit 58a includes a resistance element 58a1, one of two ends of which receives the control signal for controlling the switching element 52a, and a capacitance element 58a2, one of two ends of which is connected to the other end of the resistance element 58a1. The other end of the resistance element 58a1 is further connected to the control circuit 56, and the other end of the capacitance element 58a2 is grounded.

The temporal coefficient circuit 58b includes a resistance element 58b1, one of two ends of which receives the control signal for controlling the switching element 52b, and a capacitance element 58b2, one of two ends of which is connected to the other end of the resistance element 58b1. The other end of the resistance element 58b1 is further connected to the control circuit 56, and the other end of the capacitance element 58b2 is grounded.

Hereinafter, an operation of the power supply device 50 of the fourth embodiment will be described.

Figure 12:
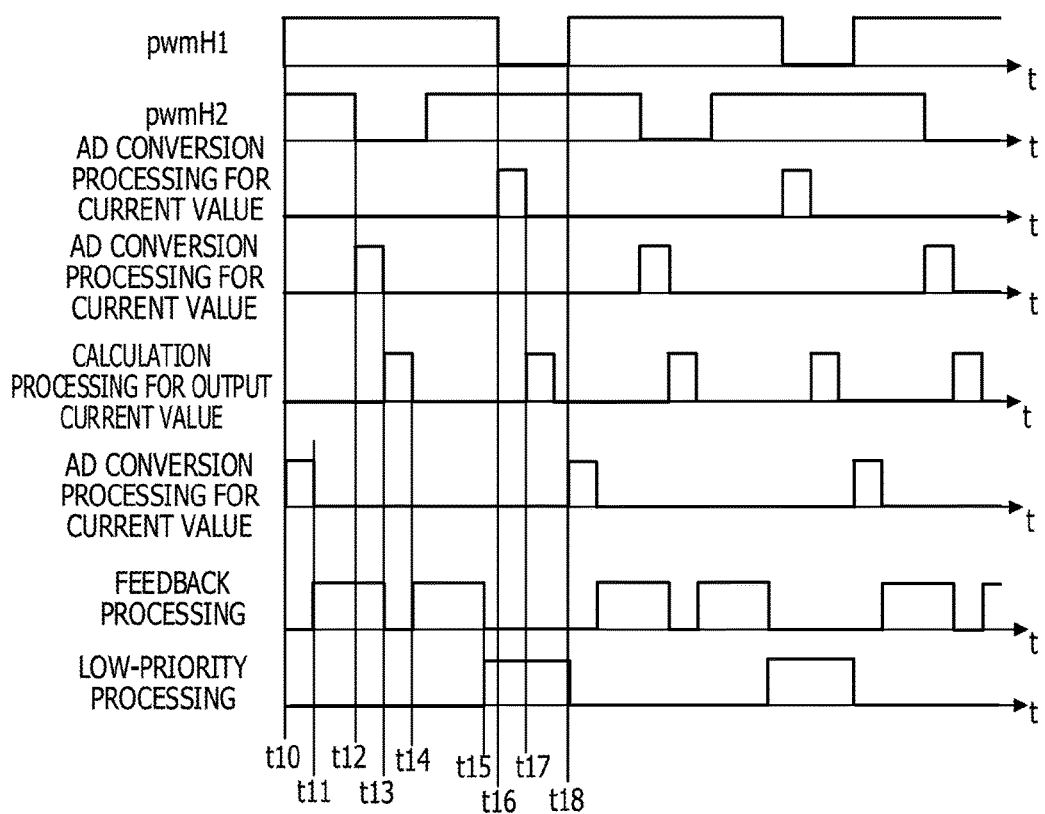
FIG. 12 is a timing chart illustrating an example of an operation of the power supply device of the fourth embodiment.

FIG. 12 is a timing chart illustrating an example of an operation of the power supply device of the fourth embodiment.

FIG. 12 illustrates examples of temporal changes in a control signal pwmH1 that is used for the switching element 51a and that is output by the control circuit 56 and a control signal pwmH2 that is used for the switching element 51b and that is output by the control circuit 56. In addition, examples of operation timings of AD conversion processing for the peak current value sensed by the current sensing circuit 54a, AD conversion processing for the peak current value sensed by the current sensing circuit 54b, calculation processing for the output current value, AD conversion processing for a voltage value, feedback processing, and low-priority processing are illustrated.

The control signal pwmH1 and the control signal pwmH2 differ in phase by 90 degrees. Note that illustrations of the control signals for the switching elements 52a and 52b are omitted. The control signal for the switching element 52a is a signal that differs from the control signal pwmH1 in phase by 180 degrees. In addition, the control signal for the switching element 52b is a signal that differs from the control signal pwmH2 in phase by 180 degrees.

In a case where the control signal pwmH1 rises to the H level (at a timing t10), the AD conversion processing for the voltage value (the output voltage value of the power supply device 50), based on the control circuit 56, is started. In a case where that AD conversion processing finishes (at a timing t11), the feedback processing (adjustment processing for a duty ratio) based on the control circuit 56 is performed. Note that while, in the same way as the control circuit 16 in the power supply device 10 of the first embodiment, performing such various functions as illustrated in FIG. 2, the control circuit 56 adjusts the duty ratios for the respective power supply circuits 50a and 50b.

In a case where the control signal pwmH2 falls to the L level (at a timing t12), the AD conversion processing for a current value (the peak current value) sensed by the current sensing circuit 54b, based on the control circuit 56, is started. In a case where that AD conversion processing finishes (at a timing t13), the calculation processing for the output current value of the power supply circuit 50b, based on the control circuit 56, is started. During the calculation processing for the output current value, the feedback processing is interrupted. In other words, the calculation of the output current value is performed in priority to the feedback processing.

In a case where the calculation processing for the output current value finishes (at a timing t14), the feedback processing is resumed. In a case where the feedback processing finishes (at a timing t15), the control circuit 56 performs the low-priority processing (communication processing utilizing, for example, a communication interface not illustrated, or the like).

In a case where the control signal pwmH1 falls to the L level (at a timing t16), the AD conversion processing for a current value (the peak current value) sensed by the current sensing circuit 54a, based on the control circuit 56, is started. In a case where that AD conversion processing finishes (at a timing t17), the calculation processing for the output current value of the power supply circuit 50a, based on the control circuit 56, is started.

In a case where the control signal pwmH1 rises to the H level again (at a timing t18), the AD conversion processing for the voltage value (the output voltage value of the power supply device 50), based on the control circuit 56, is started. After that, the same processing operations are performed.

Note that a flow of an operation of the entire power supply device 50 of the fourth embodiment is the same as the flow of the operation of the power supply device 10 of the first embodiment illustrated in FIG. 5 to FIG. 7.

In the power supply device 50 of the fourth embodiment, the same advantage as that of the power supply device 10 of the first embodiment is obtained.

Note that while the number of phases of the above-mentioned power supply device 50 is two, the number of phases may be three or more. In addition, while the above-mentioned power supply device 50 is equivalent to an example in which the power supply device 10 of the first embodiment is set to a multi-phase type, the power supply device 10a or 10b of the second or third embodiment may be set to the multi-phase type in the same way.

A calculation amount increases with an increase in the number of phases in the multi-phase type power supply device. However, by using such a temporal coefficient circuit as described above or the output value of the voltage-dividing circuit, the output current value is calculated, thereby enabling an increase in the calculation amount to be suppressed.

In a case where there is used an MCU (an MCU with 40 million instructions per second (MIPS), for example) in which the number of clock cycles for performing subtraction is two and in which the number of clock cycles for performing division and multiplication is four, for example, the number of clock cycles in calculation of the output current value is as follows.

The number of clock cycles used in a case where the above-mentioned MCU calculates the output current value of a four-phase power supply device by using Expression (1) is $(2\times2+4\times2+4\times1)\times4=64$.

On the other hand, the number of clock cycles used in a case where the above-mentioned MCU calculates the output current value of the four-phase power supply device by using Expression (8) is $(2\times1+4\times2)\times4=40$.

In addition, the number of clock cycles used in a case where the above-mentioned MCU calculates the output current value of the four-phase power supply device by using Expression (14) is $(2\times1+4\times1)\times4=24$.

In a case of the MCU with 40 MIPS, if a switching frequency of the power supply device is 200 kHz, the number of clock cycles of the MCU per one switching period is 40 M/200 k=200. Accordingly, a load at a time when the MCU calculates the output current value is 64/200=0.32 in a case of using Expression (1), the load at a time when the MCU calculates the output current value is 40/200=0.2 in a case of using Expression (8), and the load at a time when the MCU calculates the output current value is 24/200=0.12 in a case of using Expression (14). In this way, the load at a time of calculating the output current value by using Expression (8) or Expression (14) becomes lower than that at a time of calculating the output current value by using Expression (1). Therefore, it becomes possible to reduce power consumption of the MCU, and furthermore, it is possible to use an inexpensive MCU.

Fifth Embodiment

Note that while, in the above description, examples in which the temporal coefficient circuits 18, 58a, and 58b and the voltage-dividing circuit 19 are placed outside the control circuits 16 and 56 are explained, the temporal coefficient circuits 18, 58a, and 58b and the voltage-dividing circuit 19 may be embedded in the control circuits 16 and 56.

Figure 13:
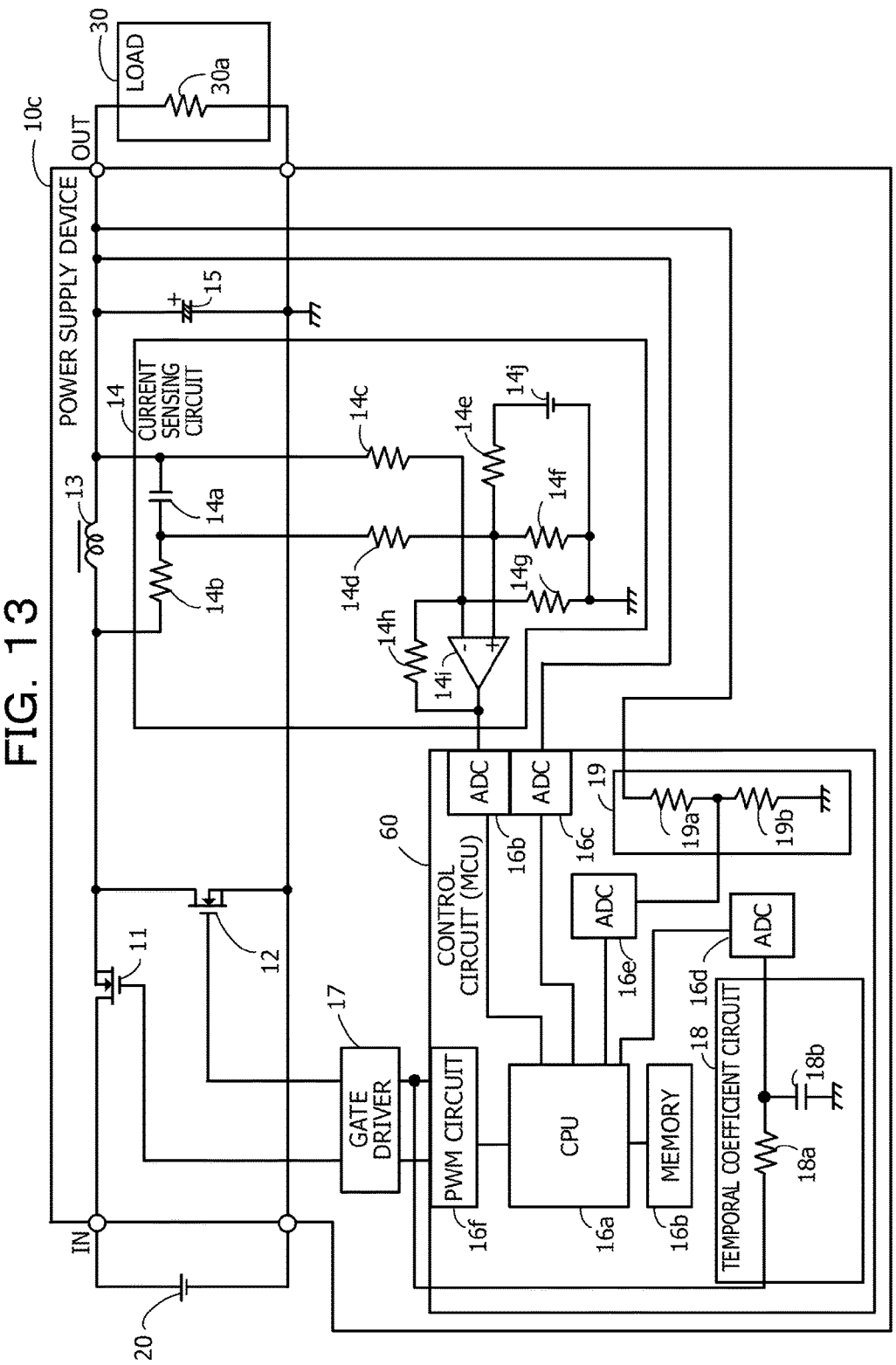
FIG. 13 is a diagram illustrating an example of a power supply device of a fifth embodiment.

FIG. 13 is a diagram illustrating an example of a power supply device of a fifth embodiment. In FIG. 13, the same symbol is assigned to the same element as that in the power supply device 10b illustrated in FIG. 8.

In a power supply device 10c of the fifth embodiment, a control circuit 60 incorporates the temporal coefficient circuit 18 and the voltage-dividing circuit 19 and has the same advantage as that of the power supply device 10b of the third embodiment. Furthermore, in the power supply device 10c of the fifth embodiment, it is possible to reduce an external circuit of the control circuit 60. Note that, in the power supply device 10, 10a, or 50 of the first, second, or fourth embodiment, the control circuit 16 or 56 may incorporate the temporal coefficient circuit 18, 58a, or 58b.

Sixth Embodiment

Note that while the multi-phase type power supply device 50 is described in the fourth embodiment, a control circuit may calculate, by using the output value of such a temporal coefficient circuit or voltage-dividing circuit as described above, output current values of respective power supply circuits causing loads to operate.

Figure 14:
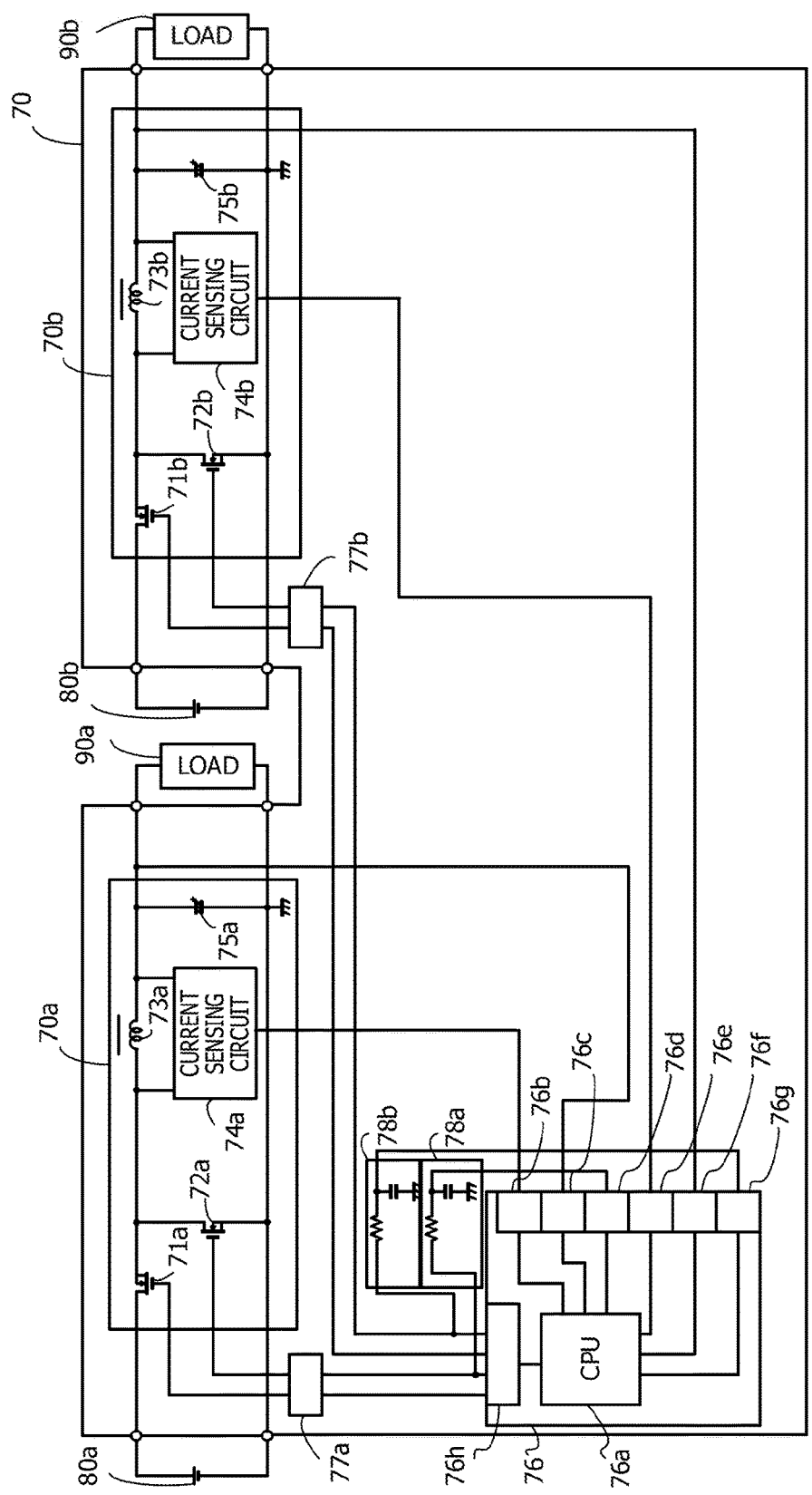
FIG. 14 is a diagram illustrating an example of a power supply device of a sixth embodiment.

FIG. 14 is a diagram illustrating an example of a power supply device of the sixth embodiment.

A power supply device 70 of the sixth embodiment includes a power supply circuit 70a that converts a magnitude of an input voltage supplied by a power supply 80a, thereby supplying the input voltage to a load 90a, and a power supply circuit 70b that converts a magnitude of an input voltage supplied by a power supply 80b, thereby supplying the input voltage to a load 90b.

The power supply circuit 70a includes switching elements 71a and 72a, an inductance element 73a, a current sensing circuit 74a, and a capacitance element 75a. The power supply circuit 70b includes switching elements 71b and 72b, an inductance element 73b, a current sensing circuit 74b, and a capacitance element 75b.

The two switching elements 71a and 72a in the power supply circuit 70a and the two switching elements 71b and 72b in the power supply circuit 70b correspond to the respective switching elements 11 and 12 in the power supply device 10 of the first embodiment, for example. The inductance element 73a in the power supply circuit 70a and the inductance element 73b in power supply circuit 70b each correspond to the inductance element 13 in the power supply device 10 of the first embodiment, for example. The capacitance element 75a in the power supply circuit 70a and the capacitance element 75b in the power supply circuit 70b each correspond to the capacitance element 15 in the power supply device 10 of the first embodiment, for example.

Furthermore, the power supply device 70 includes a control circuit 76, gate drivers 77a and 77b, and temporal coefficient circuits 78a and 78b.

The control circuit 76 includes a CPU 76a, ADCs 76b, 76c, 76d, 76e, 76f, and 76g, and a PWM circuit 76h. Note that while the control circuit 76 includes a memory, an illustration of the memory is omitted in FIG. 14.

The CPU 76a receives a peak current value of the inductance element 73a, AD-converted by the ADC 76b, an output voltage value of the power supply circuit 70a, AD-converted by the ADC 76c, and an output value of the temporal coefficient circuit 78a, AD-converted by the ADC 76d. Note that the temporal coefficient circuit 78a outputs an output value obtained by performing filtering on a control signal for controlling the switching element 72a. Based on the individual received values, the CPU 76a calculates an output current value of the power supply circuit 70a by using Expression (8). In addition, based on the output voltage value and the output current value, the CPU 76a performs such functions as illustrated in FIG. 2 and sends, to the PWM circuit 76h, duty ratios of switching operations of the respective switching elements 71a and 72a. In addition, in a case where the output current value is an overcurrent, the CPU 76a sends, to the PWM circuit 76h, a stop signal for stopping switching operations of the respective switching elements 71a and 72a, for example.

In addition, the CPU 76a receives a peak current value of the inductance element 73b, AD-converted by the ADC 76e, an output voltage value of the power supply circuit 70b, AD-converted by the ADC 76f, and an output value of the temporal coefficient circuit 78b, AD-converted by the ADC 76g. Note that the temporal coefficient circuit 78b outputs an output value obtained by performing filtering on a control signal for controlling the switching element 72b. Based on the individual received values, the CPU 76a calculates an output current value of the power supply circuit 70b by using Expression (8). In addition, based on the output voltage value and the output current value, the CPU 76a performs such functions as illustrated in FIG. 2 and sends, to the PWM circuit 76h, duty ratios of switching operations of the respective switching elements 71b and 72b.

In addition, in a case where the output current value is an overcurrent, the CPU 76a sends, to the PWM circuit 76h, a stop signal for stopping switching operations of the respective switching elements 71b and 72b, for example.

Based on the duty ratios, the PWM circuit 76h outputs control signals for controlling the switching elements 71a, 72a, 71b, and 72b.

The gate driver 77a receives the control signals for controlling the switching elements 71a and 72a, and, based on the control signals, the gate driver 77a outputs control voltages (gate voltages of respective n-channel type MOSFETs, for example) to be supplied to control terminals of the respective switching elements 71a and 72a.

The gate driver 77b receives the control signals for controlling the switching elements 71b and 72b, and, based on the control signals, the gate driver 77a outputs control voltages (gate voltages of respective n-channel type MOSFETs, for example) to be supplied to control terminals of the respective switching elements 71b and 72b.

In such a power supply device 70 of the sixth embodiment as described above, the same advantage as that of the power supply device 10 of the first embodiment is obtained.

Note that while, in the above-mentioned example, an example in which the two power supply circuits 70a and 70b are placed is illustrated, three or more power supply circuits may be placed. A calculation amount in the control circuit 76 increases with an increase in the number of power supply circuits. However, by using such an output value of the temporal coefficient circuit as described above, the output current value is calculated, thereby enabling an increase in the calculation amount to be suppressed.

Note that while, in the above description, it is assumed that the temporal coefficient circuits 78a and 78b output output values obtained by performing filtering on the control signals for controlling the switching elements 72a and 72b, there is no limitation to this. The temporal coefficient circuits 78a and 78b may output output values obtained by performing filtering on the control signals for controlling the switching elements 71a and 71b. In addition, the temporal coefficient circuits 78a and 78b may be placed within the control circuit 76 in the same way as in the power supply device 10c of the fifth embodiment. In addition, the power supply device 70 may include a voltage-dividing circuit that voltage-divides an output voltage value Vo of each of the power supply circuits 70a and 70b, thereby outputting "k·Vo", and the control circuit 76 may calculate the output current values of the respective power supply circuits 70a and 70b by using Expression (14).

As above, based on embodiments, aspects of the power supply device, the control circuit for the power supply device, and the control method for the power supply device of the present technology are described. However, these are just examples, and there is no limitation to the above description.

The temporal coefficient circuit is not limited to a circuit including a capacitance element and a resistance element and may be as follows, for example.

Figure 15:
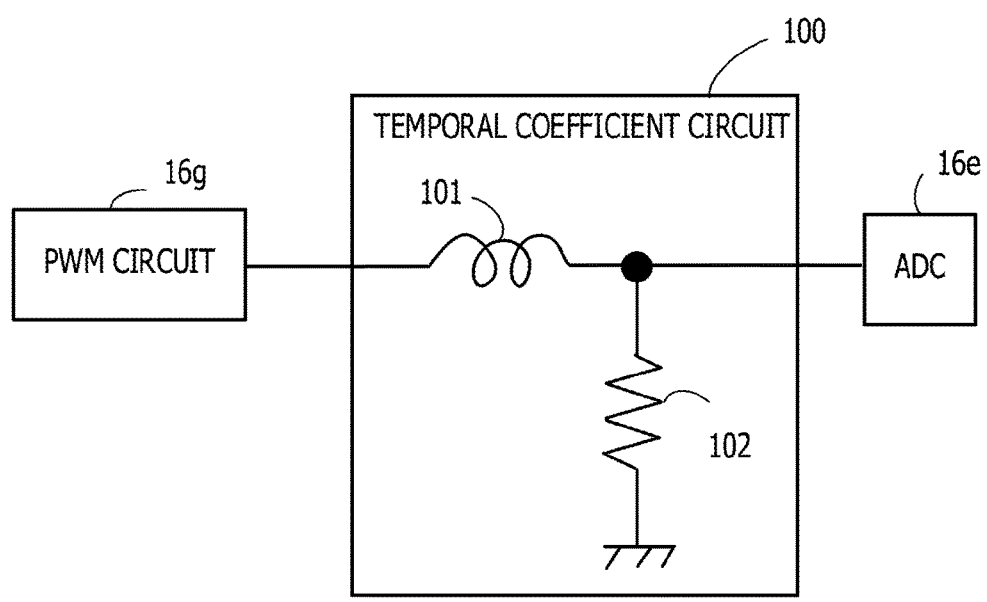
FIG. 15 is a diagram illustrating another example of the temporal coefficient circuit.

FIG. 15 is a diagram illustrating another example of the temporal coefficient circuit.

A temporal coefficient circuit 100 illustrated in FIG. 15 includes an inductance element 101 and a resistance element 102. One of two ends of the inductance element 101 is connected to, for example, the PWM circuit 16g illustrated in FIG. 1, and the other end of the inductance element 101 is connected to one of two ends of the resistance element 102 and the ADC 16e illustrated in FIG. 1. The other end of the resistance element 102 is grounded.

Such a temporal coefficient circuit 100 functions as a low pass filter and is able to perform filtering on a control signal output by the PWM circuit 16g, thereby outputting the same output value as that of the temporal coefficient circuit 18 illustrated in FIG. 1 or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power supply device coupled to a load comprising:
   a first switch that switches a current input from an input terminal;
   a second switch that switches between a ground potential and an output of the first switch;
   an inductor that establishes a connection between an output terminal and the output of the first switch;
   a current sensing circuit that senses a peak current value serving as a peak value of a current flowing through the inductor; and
   a control circuit that controls a first control terminal of the first switch and a second control terminal of the second switch and that calculates a value of an output current flowing through the load, based on an output value of a temporal coefficient circuit coupled to one of a first control signal for controlling the first control terminal and a second control signal for controlling the second control terminal and on the peak current value sensed by the current sensing circuit.

2. The power supply device according to claim 1, wherein the control circuit
   calculates the value of the output current flowing through the load, based on the output value of the temporal coefficient circuit, the peak current value sensed by the current sensing circuit, and an output value of a voltage-dividing circuit coupled to the load.

3. The power supply device according to claim 1, further comprising:
   a first power supply circuit that includes the first switch, the second switch, the inductor, and the current sensing circuit; and
   a second power supply circuit that includes a third switch, which switches the current input from the input terminal, a fourth switch, which switches between the ground potential and an output of the third switch, another inductor, which establishes a connection between the output terminal and the output of the third switch, and another current sensing circuit, which senses another peak current value serving as a peak value of a current flowing through the other inductor, and that is coupled in parallel to the first power supply circuit between the input terminal and the output terminal, wherein
   the control circuit controls the first control terminal and the second control terminal and calculates an output current value of the first power supply circuit, based on the output value of the temporal coefficient circuit and the peak current value, wherein the control circuit further controls a third control terminal of the third switch and a fourth control terminal of the fourth switch and calculates an output current value of the second power supply circuit, based on an output value of another temporal coefficient circuit coupled to one of a third control signal for controlling the third control terminal and a fourth control signal for controlling the fourth control terminal and on the other peak current value sensed by the other current sensing circuit.

4. The power supply device according to claim 1, further comprising:
   a first power supply circuit that includes the first switch, the second switch, the inductor, and the current sensing circuit; and
   a second power supply circuit that includes a third switch, which switches another current input from another input terminal, a fourth switch, which switches between the ground potential and an output of the third switch, another inductor, which establishes a connection between another output terminal connected to another load and the output of the third switch, and another current sensing circuit, which senses another peak current value serving as a peak value of a current flowing through the other inductor, wherein
   the control circuit controls the first control terminal and the second control terminal and calculates an output current value of the first power supply circuit, based on the output value of the temporal coefficient circuit and the peak current value, wherein the control circuit further controls a third control terminal of the third switch and a fourth control terminal of the fourth switch and calculates an output current value of the second power supply circuit, based on an output value of another temporal coefficient circuit coupled to one of a third control signal for controlling the third control terminal and a fourth control signal for controlling the fourth control terminal and on the other peak current value sensed by the other current sensing circuit.

5. A control circuit for a power supply device that includes a first switch, which switches a current input from an input terminal, a second switch, which switches between a ground potential and an output of the first switch, an inductor, which establishes a connection between an output terminal and the output of the first switch, and a current sensing circuit, which senses a peak current value serving as a peak value of a current flowing through the inductor, and that is coupled to a load, the control circuit comprising:
   a gate control circuit that controls a first control terminal of the first switch and a second control terminal of the second switch;

a temporal coefficient circuit coupled to one of a first control signal for controlling the first control terminal and a second control signal for controlling the second control terminal; and a calculation circuit that calculates a value of an output current flowing through the load, based on an output value of the temporal coefficient circuit and the peak current value sensed by the current sensing circuit.

6. A control method for a power supply device coupled to a load, the control method comprising:

switching a current input from an input terminal by using a first switch included in the power supply device;

switching between a ground potential and an output of the first switch by using a second switch included in the power supply device;

sensing, by using a current sensing circuit included in the power supply device, a peak current value serving as a peak value of a current flowing through an inductor that establishes a connection between an output terminal and the output of the first switch; and by using a control circuit included in the power supply device, controlling a first control terminal of the first switch and a second control terminal of the second switch and calculating a value of an output current flowing through the load, based on an output value of a temporal coefficient circuit coupled to one of a first control signal for controlling the first control terminal and a second control signal for controlling the second control terminal and on the peak current value sensed by the current sensing circuit.

* * * * *